(12) United States Patent
Yamashita et al.

(10) Patent No.: US 6,518,158 B1
(45) Date of Patent: Feb. 11, 2003

(54) METHOD OF MANUFACTURING A SEMICONDUCTOR DEVICE INCLUDING A FUSE

(75) Inventors: Yasunori Yamashita; Fumitoshi Yamamoto; Tomohide Terashima, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 57 days.

(21) Appl. No.: 09/699,463

(22) Filed: Oct. 31, 2000

(30) Foreign Application Priority Data

Mar. 31, 2000 (JP) ........................................ 2000/097967

(51) Int. Cl.$^7$ ............................................... H01L 21/28
(52) U.S. Cl. ...................................................... 438/601
(58) Field of Search ................................ 438/132, 601, 438/FOR 433

(56) References Cited

U.S. PATENT DOCUMENTS 5,895,963 A * 4/1999 Yamazaki
5,970,346 A * 10/1999 Liaw
6,008,075 A * 12/1999 Lien et al.

FOREIGN PATENT DOCUMENTS

JP 9-51038 2/1997

* cited by examiner

Primary Examiner—George Fourson
Assistant Examiner—Suk-San Foong
(74) Attorney, Agent, or Firm—McDermott, Will & Emery (57) ABSTRACT

The method for manufacturing a semiconductor device includes the steps of: removing an oxide film in a region including a fuse region at the formation of an opening for the formation of a vertical interconnection in an oxide film serving as an upper insulating layer; and forming the vertical interconnection for electrically connecting interconnection layers below and above the oxide film and the interconnection layer placed on an upper side of the oxide film as one upper conductive layer at the same time.

3 Claims, 6 Drawing Sheets

METHOD OF MANUFACTURING A SEMICONDUCTOR DEVICE INCLUDING A FUSE

BACKGROUND OF THE INVENTION

1. Field of the Invention

The present invention relates to semiconductor devices with a fuse forming a redundancy circuit for repairing a defective product and a manufacturing method thereof.

2. Description of the Background Art

Figure 8:
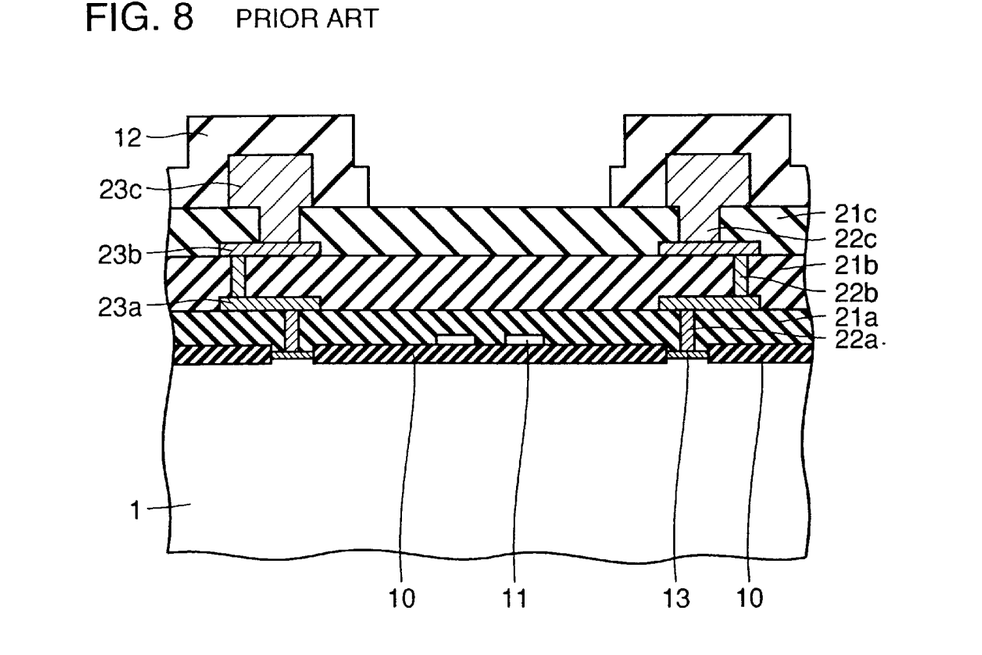
FIG. 8 is a section of a semiconductor device according to a conventional art.

FIG. 8 shows an exemplary structure of a semiconductor device with three interconnection layers and a fuse. In this semiconductor device, on a surface of a silicon substrate 1 serving as a semiconductor substrate, a field oxide film 10 is selectively formed as an isolating insulating film. Further, a fuse 11 is selectively formed from polycrystalline silicon so as to contact with an upper side of field oxide film 10. Fuse 11 is an element constituting a redundancy circuit for repairing a defective. Through the blow of fuse 11 by a laser, a defective portion can be disconnected and a normal portion can be employed instead, if necessary.

When fuse 11 of polycrystalline silicon is to be formed on a semiconductor device, which is a so-called "three-layer product", having three interconnection layers on a semiconductor substrate with an insulating layer interposed between each interconnection layer and its adjacent layer, total thickness of three oxide films 21a, 21b, 21c serving as insulating layers for mutually isolating interconnection layers 23a, 23b, 23c exceeds 20,000 Å. Therefore, when the blow of the fuse is necessary to repair a defective product, for example, a significantly high output of the laser is required for blowing the fuse. When the output of the laser is extremely high, however, the radiation of laser causes a crack in the field oxide film under the fuse and the blown fuse directly contacts with silicon substrate 1 whereby a minute current flows.

Figure 9:
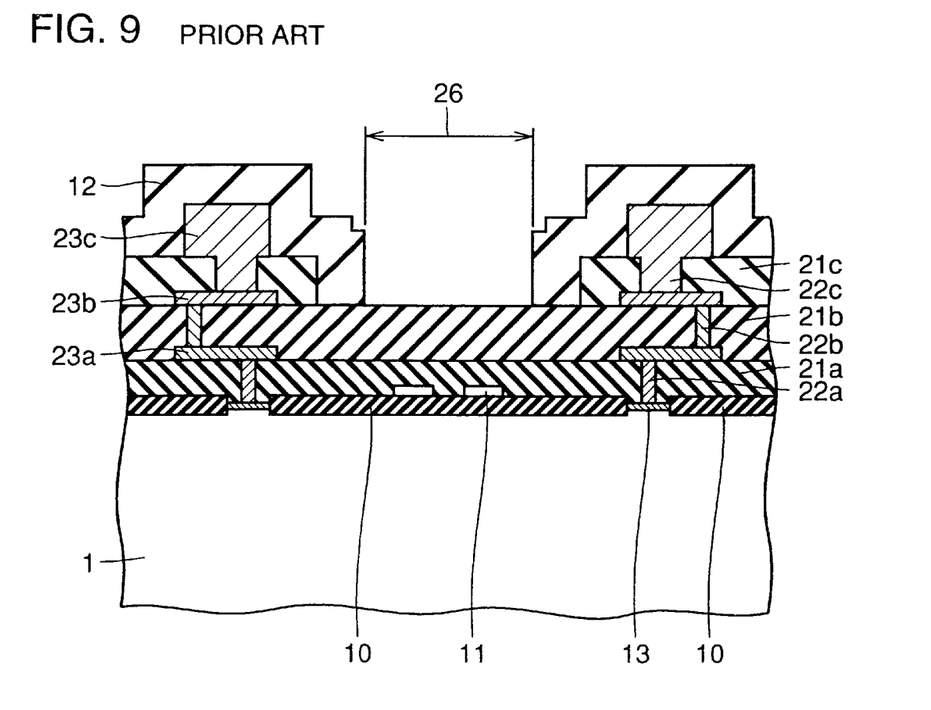
FIG. 9 is a section of a semiconductor device with an opening in a fuse region according to a conventional art.

To solve the problem described above, the oxide film can be thinned in a region above the fuse as shown in FIG. 9. Such structure is described in Japanese Patent Laying-Open No. 9-51038, for example. With such structure, the fuse can be securely blown by the laser with an output of the same level both in the three-layer product and a product with one layer of an oxide film. At the same time, as the fuse blow is possible with a low laser output, undesirable effect such as crack of the field oxide film can be prevented.

Next, a process for obtaining the structure shown in FIG. 9 will be described.

Figure 10:
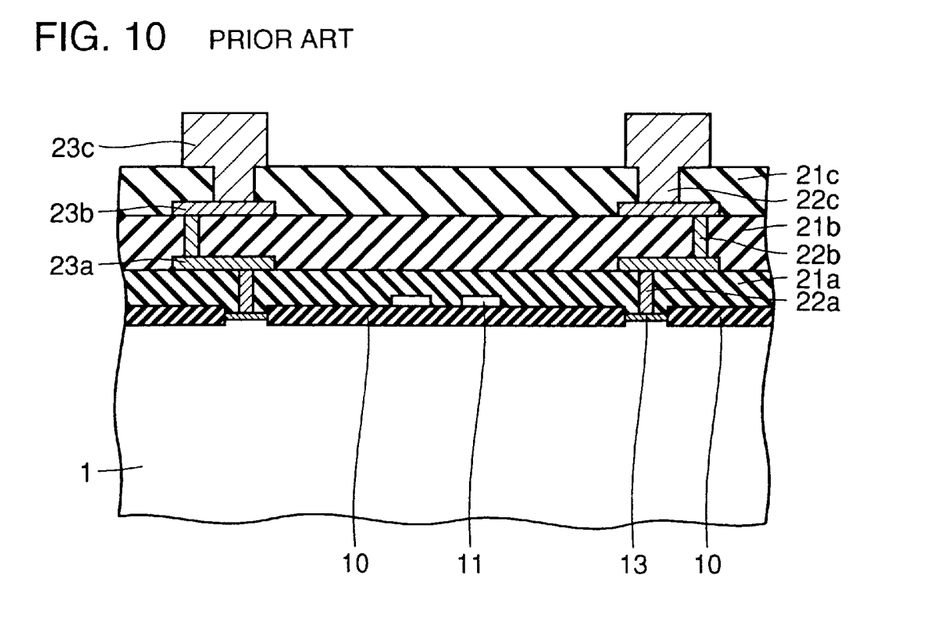
FIG. 10 is a section referenced for describing a first manufacturing step of a semiconductor device with an opening in a fuse region according to a conventional art.

First, a structure shown in FIG. 10 is formed. In particular, a field oxide film 10 with a thickness of about 5000 Å is formed on a silicon substrate 1, and a fuse 11 of polycrystalline silicon is formed on field oxide film 10. Then, an oxide film 21a with a thickness of about 8000 Å is formed so as to cover fuse 11. A vertical interconnection 22a electrically connecting a contact 13 with an upper part is provided to form a first interconnection layer 23a. Then an oxide film 21b with a thickness of about 12,000 Å is formed so as to cover an upper side of first interconnection layer 23a. Then, a vertical interconnection 22b electrically connecting first interconnection layer 23a with an upper part is provided to form a second interconnection layer 23b. Further, a vertical interconnection 22c electrically connecting second interconnection layer 23b with an upper part is provided to form a third interconnection layer 23c. Thus the structure shown in FIG. 10 is obtained.

Figure 11:
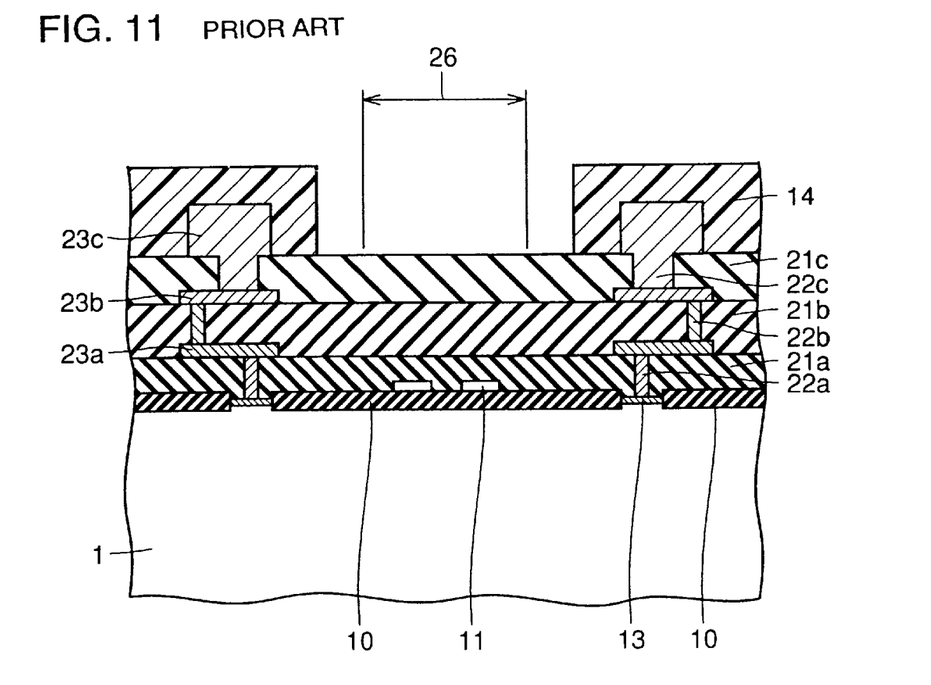
FIG. 11 is a section reference for describing a second manufacturing step of a semiconductor device with an opening in a fuse region according to a conventional art.

With reference to FIG. 11 a photolithography is performed to form a resist mask 14 for removing oxide film 21c in a region including a region 26 (hereinafter referred to as "fuse region") above fuse 11 by the etching. Here, resist mask 14 is formed with an opening slightly wider than fuse region 26 therein to accommodate the decrease in the opening area in a subsequent step caused by the formation of a glass coat 12 (see FIG. 9) with a thickness.

Figure 12:
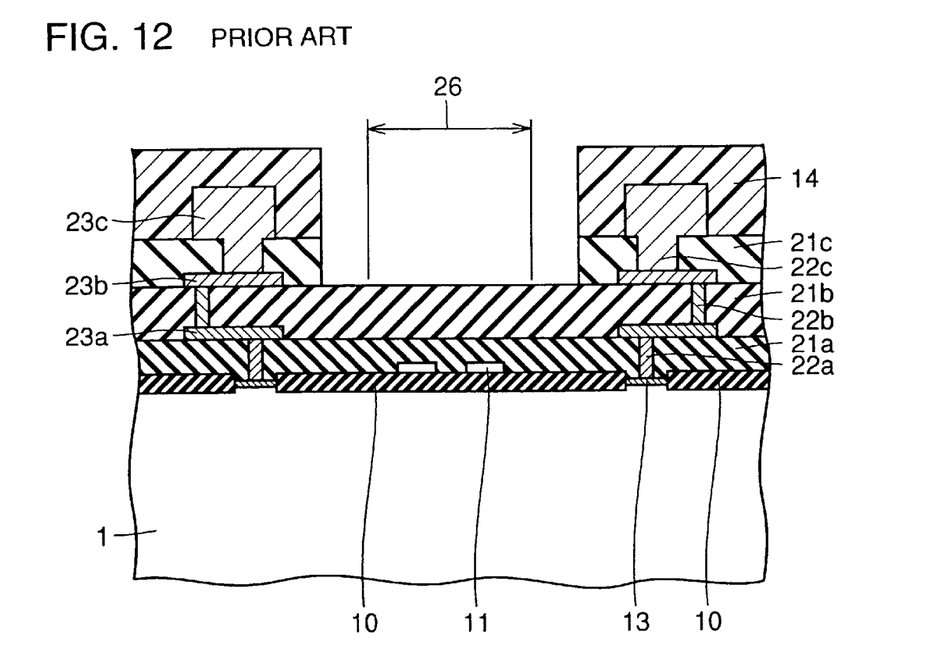
FIG. 12 is a section referenced for describing a third manufacturing step of a semiconductor device with an opening in a fuse region according to a conventional art.

With reference to FIG. 12, oxide film 21c with the thickness of about 8000 Å is removed by the wet etching and dry etching using resist mask 14. After the removal of resist mask 14, glass coat 12 is deposited through CVD (Chemical Vapor Deposition). Further, a mask (not shown) is formed on glass coat 12 for the formation of the opening in glass coat 12. Then the photolithography and etching are performed so as to form fuse region 26 with a predetermined opening pattern. Then with the removal of the material of mask, the structure shown in FIG. 9 is eventually obtained.

When the structure as shown in FIG. 9 as described above is to be obtained, in order to form an opening in fuse region 26, an additional mask must be formed after the formation of glass coat 12, and then the photolithography and the etching must be formed. Thus the number of the required process steps increases. In addition, an additional amount of the mask material is necessary.

Therefore, an object of the present invention is to provide a semiconductor device and a manufacturing method thereof allowing the reduction in the number of process steps and the amount of necessary mask material.

SUMMARY OF THE INVENTION

To solve the problems described above, a method of manufacturing a semiconductor device according to the present invention includes the steps of: forming a fuse in contact with an upper surface of the isolating insulating film formed on a main surface of a semiconductor substrate; forming a lower insulating layer on the semiconductor substrate and selectively forming a lower interconnection layer in contact with an upper surface of the lower insulating layer; selectively forming an upper insulating layer in contact with upper surfaces of the lower insulating layer and the lower interconnection layer, and covering a region except an uppermost vertical interconnection region viewed from above including a vertical interconnection for electrically connecting the lower interconnection layer and another interconnection layer above and an internal region of the uppermost vertical interconnection region; and selectively forming an upper conductive layer in contact with exposed upper surfaces of the lower insulating layer, the lower interconnection layer and the upper insulating layer in a region outside a fuse region covering a plane region including the fuse and a neighborhood thereof With the above-described method, in the step of selectively forming the upper insulating layer, the upper insulating layer is formed in the form having the opening for the vertical interconnection to be formed in the upper insulating. In addition, the vertical interconnection for electrically connecting interconnection layers placed above and below the upper insulating layer and the interconnection layer to be placed on the upper side of the upper insulating layer are formed together as one conductive layer. Thus the number of process steps can be reduced.

In one embodiment of the above-mentioned invention, the step of selectively forming an upper conductive layer includes the steps of: forming the upper insulating layer in contact with upper surfaces of the lower insulating layer and the lower interconnection layer; and removing the upper insulating layer in the uppermost vertical interconnection region and the internal region.

With the above-described method, in the step of selectively forming the upper insulating layer, the upper insulating layer is removed not only in the region corresponding to the opening for the vertical interconnection to be formed in the upper insulating layer but also in the fuse region. Thus the number of process steps can be reduced. Along with the reduction in the number of process steps, the necessary amount of mask material can be reduced as the number of etching processes can be reduced.

In the above-mentioned invention, the step of selectively forming an upper conductive layer preferably includes a step of forming the upper conductive layer outside of the fuse region at a distance not shorter than the thickness of the coating intended to be formed on the upper conductive layer from an outline of the fuse region.

With the above-described method, the fuse region can certainly be maintained in an opening state even if a coating is performed on the upper conductive layer in a later step.

Further, to solve the problems described above, a semiconductor device according to the present invention includes: a semiconductor substrate; an isolating insulating film formed on a main surface of the semiconductor substrate; a fuse formed in contact with an upper surface of the isolating insulating film; a lower insulating layer and a lower interconnection layer selectively formed to be in contact with an upper surface of lower insulating layer on the semiconductor substrate; an upper insulating layer selectively formed to be in contact with upper surfaces of the lower insulating layer and the lower interconnection layer; the upper insulating layer being placed only in a region outside the uppermost vertical interconnection region covering a plane region viewed from above including vertical interconnection for electrically connecting the interconnection layer in contact with the lower surface of the upper insulating layer and another interconnection layer in contact with the upper surface of the upper insulating layer; and an upper conductive layer selectively formed to be in contact with exposed upper surfaces of the lower insulating layer, the lower interconnection layer and the upper insulating layer in a region outside a fuse region covering a plane region including the fuse and a neighborhood thereof.

With the structure as described above, the semiconductor device can be manufactured through the manufacturing method with a reduced number of process steps as described above.

In one embodiment of the above-mentioned invention, the upper conductive layer is formed outside of the fuse region at a distance not shorter than the thickness of the coating intended to be formed on the upper conductive layer from an outline of the fuse region.

With the above-described structure, it is able to maintain the fuse region a certainly opening status even if a coating is performed on the upper conductive layer in a later step.

In the above-mentioned invention, the semiconductor device preferably comprises another insulating layer formed between the semiconductor substrate and the lower insulating layer.

With the above-described structure, a total thickness of insulating layers is tend to increase, and thus the thickness of insulating layers decreases more effectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
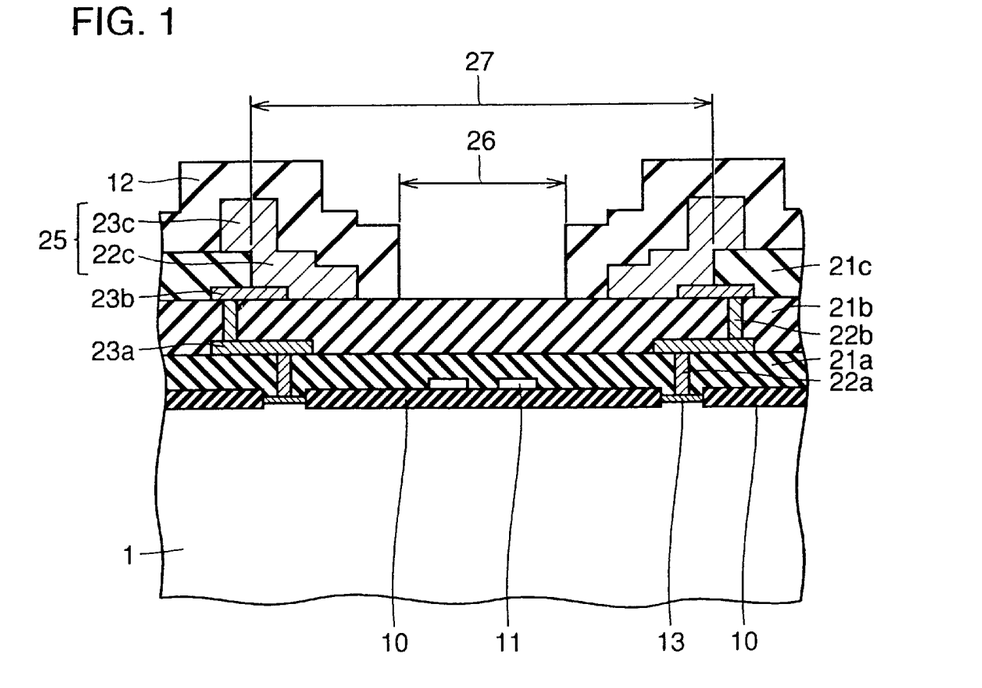
FIG. 1 is a section of a semiconductor device according to an embodiment of the present invention.

A structure of a semiconductor device according to the preferred embodiment of the present invention is shown in FIG. 1. The semiconductor device includes a semiconductor substrate 1, a field oxide film 10 in contact with an upper side of semiconductor substrate 1 and serving as an isolating insulating film, and a fuse 11 in contact with an upper side of field oxide film 10. Further, the semiconductor device includes an oxide film 21b serving as a lower insulating layer above semiconductor substrate 1, an interconnection layer 23b in contact with an upper surface of oxide film 21b and serving as a lower interconnection layer, an oxide film 21a serving as an insulating layer, an interconnection layer 23a in contact with an upper side of oxide film 21a, an oxide film 2c serving as an upper insulating layer and an upper conductive layer 25.

A vertical interconnection 22c for electrically connecting interconnection layer 23b in contact with a lower side of oxide film 21c and an interconnection layer 23c in contact with an upper side of oxide film 21c is a part of upper conductive layer 25 in FIG. 1. In upper conductive layer 25, there is no clear boundary between vertical interconnection 22c and interconnection layer 23c and these two are formed as an integral portion. In upper conductive layer 25, a portion placed above insulating layer 21c is interconnection layer 23c. Similar to vertical interconnections 22a and 22b electrically connecting upper and lower interconnection layers thereof, vertical interconnection 22c is required to electrically connecting interconnection layers 23b and 23c.

Here, a plane region of vertical interconnection 22c viewed from above will be referred to as "uppermost vertical interconnection region" and a plane region including fuse 11 and its surrounding viewed from above will be referred to as "fuse region". In the section shown in FIG. 1, the uppermost vertical interconnection regions are disposed at right and left sides with a fuse region 26 placed therebetween. The uppermost vertical interconnection region is formed so as to extend approximately perpendicular to the paper face of FIG. 1 or as to surround fuse region 26 when viewed from above. A region 27 including the uppermost vertical interconnection region and a region placed between or surrounded by the uppermost vertical interconnection regions will be referred to as "uppermost vertical interconnection and internal region". In uppermost vertical interconnection and internal region 27, oxide film 21c as the upper insulating layer does not exist. Upper conductive layer 25 is selectively formed so as to contact with exposed upper surfaces of the lower insulating layer, the lower interconnection layer and the upper insulating layer outside fuse region 26.

Next, a manufacturing method of the semiconductor device according to the embodiment will be described.

Figure 2:
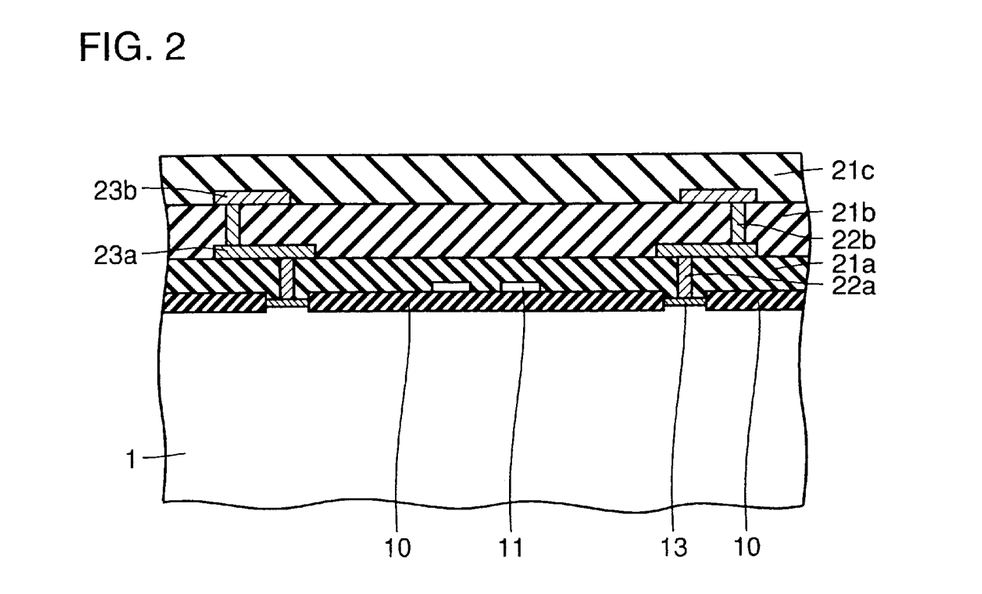
FIG. 2 is a section referenced for describing a first manufacturing step of a semiconductor device according to an embodiment of the present invention.

First, a structure shown in FIG. 2 is formed. In particular, field oxide film 10 is formed on silicon substrate 1 and fuse 11 of polycrystalline silicon is formed on field oxide film 10. Then oxide film 21a is formed so as to cover fuse 11. Then vertical interconnection 22a electrically connecting contact 13 with an upper part is provided to form first interconnection layer 23a. Oxide film 21b corresponding to the lower insulating layer is formed to cover an upper side of first interconnection layer 23a. Further, vertical interconnection 22b electrically connecting first interconnection layer 23a with an upper part is provided to form second interconnection layer 23b corresponding to the lower interconnection layer. Then, oxide film 21c corresponding to the upper insulating layer is formed so as to cover second interconnection layer 23b. Thus the structure shown in FIG. 2 is obtained.

Figure 3:
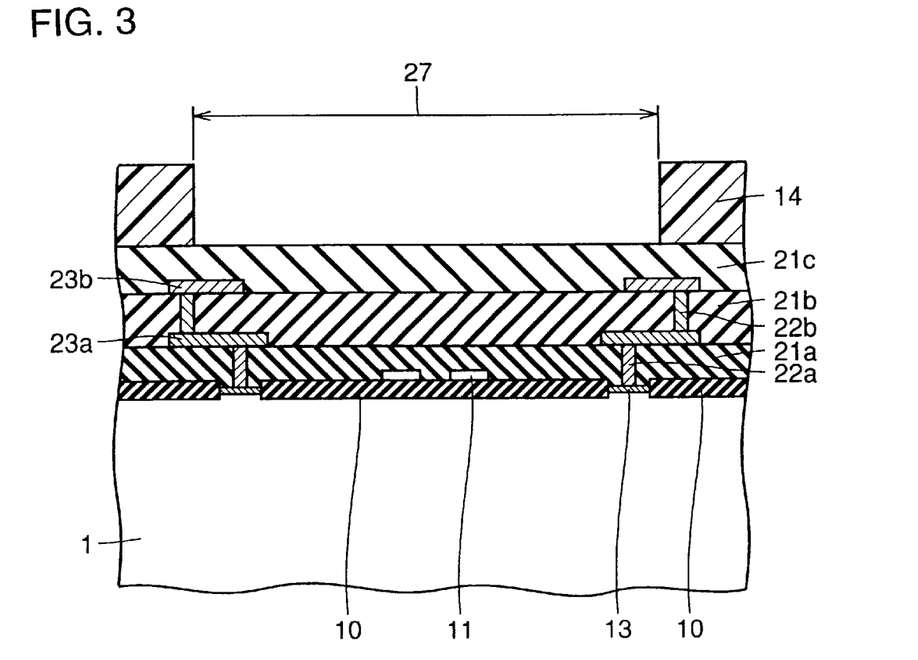
FIG. 3 is a section referenced for describing a second manufacturing step of a semiconductor device according to an embodiment of the present invention.
Figure 4:
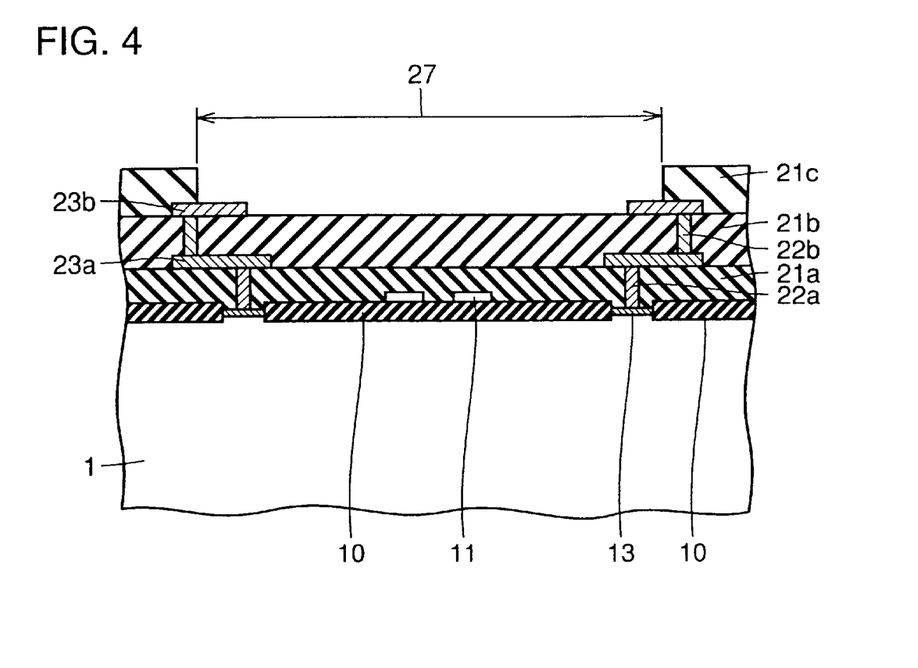
FIG. 4 is a section referenced for describing a third manufacturing step of a semiconductor device according to an embodiment of the present invention.

In the conventional method, resist mask 14 is formed and an opening is formed in oxide film 21c only in a region corresponding to vertical interconnection 22c through the etching to form vertical interconnection 22c (see FIG. 8 or FIG. 9). In this embodiment, a resist mask 14 is formed such that the opening is formed not only in a region corresponding to vertical interconnection 22c (uppermost vertical interconnection region) but also in a region of entire uppermost vertical interconnection and inner region 27 as shown in FIG. 3. With resist mask 14 in place, oxide film 21c placed in uppermost vertical interconnection and inner region 27 are removed as shown in FIG. 4.

Figure 5:
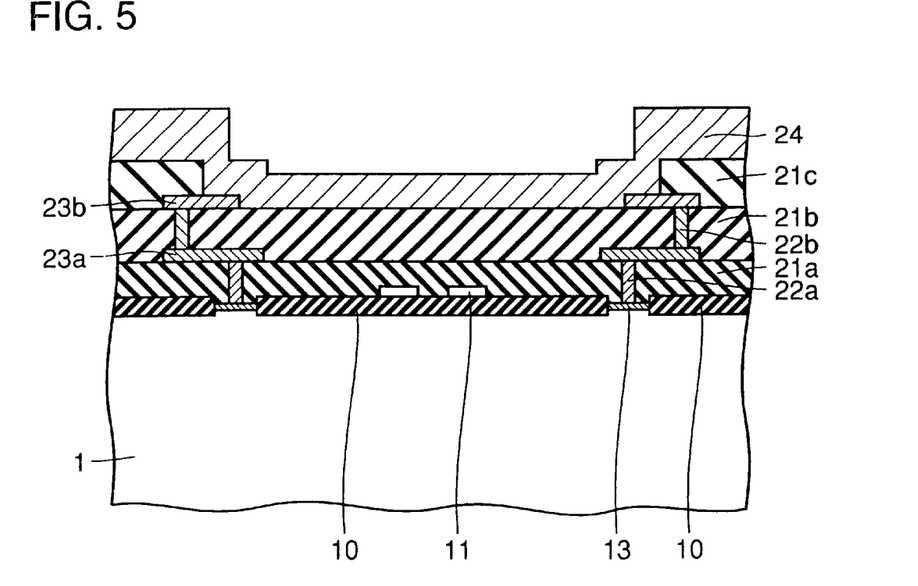
FIG. 5 is a section referenced for describing a fourth manufacturing step of a semiconductor device according to an embodiment of the present invention.
Figure 6:
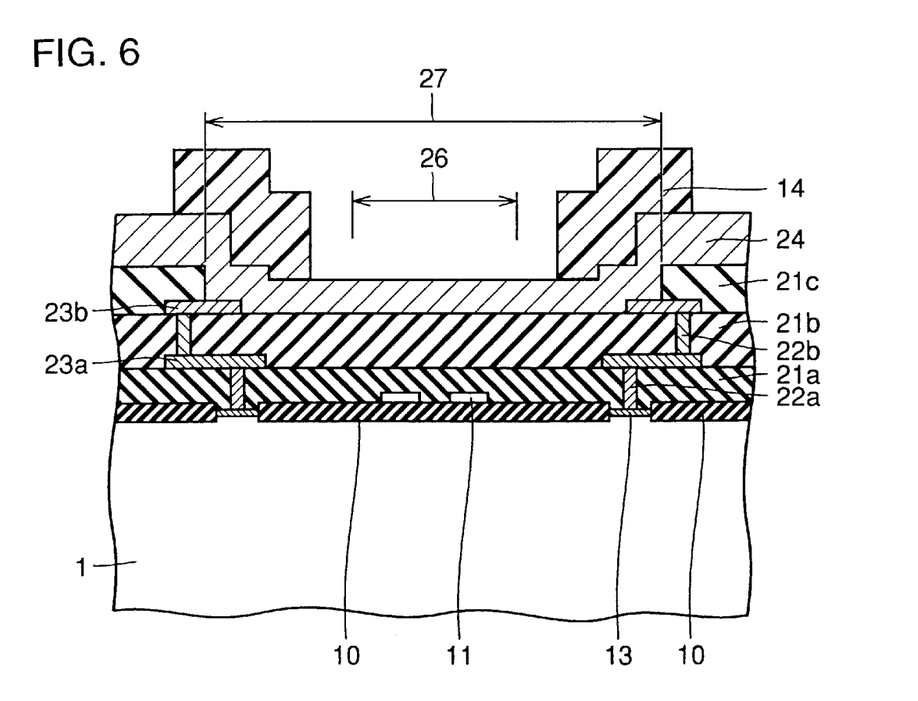
FIG. 6 is a section referenced for describing a fifth manufacturing step of a semiconductor device according to an embodiment of the present invention.

With reference to FIG. 5, a conductive layer 24 is formed through sputtering or the like. With reference to FIG. 6, resist mask 14 is selectively formed so as to cover the upper surface of conductive layer 24 corresponding to exposed upper surfaces of the lower insulating layer, the lower interconnection layer and the upper insulating layer by a predetermined amount in a region outside the fuse region. Here, resist mask 14 with an opening slightly wider than fuse region 26 is formed to accommodate the decrease in the size of the opening in a subsequent step caused by the formation of a glass coat 12 (see FIG. 1) with a certain thickness.

Figure 7:
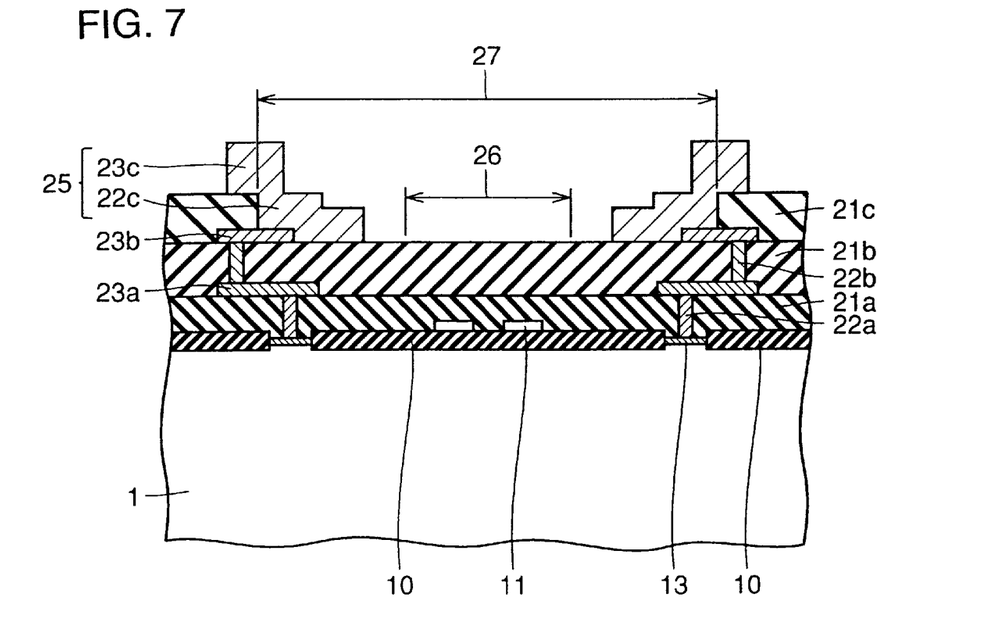
FIG. 7 is a section referenced for describing a sixth manufacturing step of a semiconductor device according to an embodiment of the present invention.

Using resist mask 14, unnecessary portion of conductive layer 24 is removed as shown in FIG. 7. As a result, upper conductive layer 25 is selectively formed so as to contact with exposed upper surfaces of the lower insulating layer, the lower interconnection layer and the upper insulating layer in the region outside the fuse region. Then with the formation of glass coat 12 through CVD or the like, the structure shown in FIG. 1 is obtained.

In the manufacturing method of the semiconductor device according to this embodiment, in the step of removing the insulating layer to form the opening for vertical interconnection 22c in oxide film 21c serving as the upper insulating layer, the insulating layer is removed not only in a region corresponding to the opening for the formation of vertical interconnection 22c but also in fuse region 26. Further, vertical interconnection 22c for electrically connecting interconnection layers 23b and 23c placed above and below oxide film 21c serving as the upper insulating layer, respectively, and interconnection layer 23c to be placed on the upper side of the upper insulating layer are formed as one portion as upper conductive layer 25. Hence, compared with the conventional method in which the opening for vertical interconnection 22c and the opening for fuse region 26 in oxide film 21c serving as the upper insulating layer are formed in separate steps, the number of process steps can be reduced. Along with the reduction in the number of process steps, the number of etching processes is reduced and the necessary amount of mask material can be reduced.

Thus, the semiconductor device of this embodiment has the advantage that it can be manufactured by the manufacturing method with a reduced number of process steps as described above.

Further, though the device with three interconnection layers is described as an example in this embodiment, the device may include more or less interconnection layers.

The material of vertical interconnections 22a, 22b, 22c and interconnection layers 23a, 23b, 23c, can be but is not limited to aluminum.

As the material of oxide films 21a, 21b, 21c, $SiO_2$ is usable but the material is not limited thereto.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming an isolating insulating film on a main surface of a semiconductor substrate;

forming a fuse in contact with an upper surface of said isolating insulating film formed on a main surface of a semiconductor substrate;

forming a lower insulating layer on said semiconductor substrate and selectively forming a lower interconnection layer in contact with an upper surface of the lower insulating layer;

selectively forming an upper insulating layer in contact with upper surfaces of said lower insulating layer and said lower interconnection layer, and covering a region except an uppermost vertical interconnection region viewed from above including a vertical interconnection for electrically connecting said lower interconnection layer and another interconnection layer above and an internal region of said uppermost vertical interconnection region; and selectively forming an upper conductive layer in contact with exposed upper surfaces of said lower insulating layer, said lower interconnection layer and said upper insulating layer in a region outside a fuse region covering a plane region including said fuse and a neighborhood thereof.

2. The method of manufacturing a semiconductor device according to claim 1, wherein said step of selectively forming an upper conductive layer includes the steps of:

forming said upper insulating layer in contact with upper surfaces of said lower insulating layer and said lower interconnection layer; and removing said upper insulating layer in said uppermost vertical interconnection region and said internal region.

3. The method of manufacturing a semiconductor device according to claim 1, wherein said step of selectively forming an upper conductive layer includes a step of forming said upper conductive layer outside of said fuse region at a distance not shorter than the thickness of a coating intended to be formed on said upper conductive layer from an outline of said fuse region.

* * * * *